United States Patent [19]
Partin et al.

[11] Patent Number: 5,196,821
[45] Date of Patent: Mar. 23, 1993

[54] INTEGRATED MAGNETIC FIELD SENSOR

[75] Inventors: Dale L. Partin, Romeo; Jackson G. Gay, Birmingham; Brian K. Fuller, Washington; Bruno P. B. Lequesne, Troy; Frederick E. Pinkerton, Shelby Township, Macomb County all of Mich.

[73] Assignee: General Motors Corporation, Detroit, Mich.

[21] Appl. No.: 848,512

[22] Filed: Mar. 9, 1992

[51] Int. Cl.$^5$ .......................................... H01L 32/00
[52] U.S. Cl. ............................ 338/32 R; 324/207.21; 357/421
[58] Field of Search ............... 338/32 R, 32 H, 309; 324/207.21, 207.13, 208, 252; 357/5, 27, 51, 63

[56] References Cited

U.S. PATENT DOCUMENTS

| | | | |
|---|---|---|---|
| 4,733,177 | 3/1988 | Pawletko | 324/207 |
| 4,883,773 | 11/1989 | Ishikura | 437/207 |
| 4,905,318 | 2/1990 | Fukuda et al. | 357/27 |
| 4,926,122 | 5/1990 | Schroeder et al. | 324/207.13 |
| 4,926,154 | 5/1990 | Heremans et al. | 338/32 |
| 4,939,456 | 7/1990 | Morelli et al. | 324/207 |
| 4,972,241 | 11/1990 | Fukuda et al. | 357/27 |
| 4,978,938 | 12/1990 | Partin et al. | 338/32 |

OTHER PUBLICATIONS

S. Kataoka, "Recent Development of Magnetoresistive Devices and Applications," Circulars of Electrotechnical Laboratory No. 182, Tokyo (1974).
B. Lequesne and T. Schroeder, "Magistor: A Novel Magnetoresistive Speed Sensor-Design and Analysis," GM Research Report E3-85 (31 May 1988), General Motors Research Laboratories.
Hiromitsu Asai, "Anisotropic Lateral Growth in GaAs MOCVD Layers on (001) Substrates", *Journal of Crystal Growth*, vol. 80, 425–433 (1987).
R. P. Gale, R. W. McClelland, J. C. Fan and C. O. Bozler, "Lateral Epitaxial Overgrowth of GaAs by Organometallic Chemical Vapor Deposition," *Applied Physics Letters*, vol. 41(6), pp. 545–547 (15 Sep. 1982).
Thomas W. Nehl and Andrzej M. Powlak, "Analysis and Computation of Electromagnetic Field Problems: ANTIC85", General Motors Research Report EG–269, 26 Feb. 1986.
H. P. Baltes and R. S. Popovic, "Integrated Semiconductor Magnetic Field Sensors", *Proceedings of IEEE*, vol. 74, 1107–1132 (1986).
S. S. Parkin, Z. G. Li and D. J. Smith, "Giant Magnetoresistance In Antiferromagnetic Co/Cu Multilayer", *Applied Physics Letters*, vol. 58, 2710–2712 (1991).

Primary Examiner—Marvin M. Lateef
Attorney, Agent, or Firm—Robert J. Wallace

[57] ABSTRACT

A magnetic field sensor, such as a magnetoresistor, includes a strip of a layer of a high electron mobility semiconductor whose electrical characteristics vary when a magnetic field is applied thereto on the surface of a body (substrate) of an insulating layer. Conductive contacts are on the strip at the ends thereof and conductive shorting bars are on and spaced along the strip to divide the strip into active regions. The body is mounted on a permanent magnet assembly which includes a magnet and a layer of a ferromagnetic material with the ferromagnetic material extending over the strip. The ferromagnetic layer is in close proximity to only the strip and, more preferably, to only the active regions of the strip so as to confine the magnetic field to the strip.

22 Claims, 4 Drawing Sheets

INTEGRATED MAGNETIC FIELD SENSOR

FIELD OF THE INVENTION

The present invention relates to an integrated magnetic field sensor, such as a magnetoresistor combined with a magnet, and, more particularly, to an integrated magnetic field sensor in which the magnetic field is more concentrated in the active region of the sensor.

BACKGROUND OF THE INVENTION

Magnetic field sensors, such as magnetoresistors, are useful for a variety of applications, such as position sensors when used with a magnet. These magnetic field sensors are typically made with active elements composed of a semiconductor material or semimetal, such as InSb, InAs, $In_{1-x}Ga_xAs$, GaAs, Si or $Bi_{1-x}Sb_x$, along with associated metal contacts, insulating passivation, etc. These devices are designed to give optimum sensitivity, when a magnetic field is applied thereto, to changes in impedance, thermal stability, etc. One form of a magnetoresistor, as shown in U.S. Pat. No. 4,926,154 (J. P. Heremans et al.), issued May 15, 1990, and entitled "Indium Arsenide Magnetoresistor," comprises a layer of a high mobility semiconductor material on an insulating substrate. Metal contacts are on the layer at the ends thereof and conductive shorting bars are on the layer and spaced therealong between the contacts. The shorting bars divide the semiconductor layer into a plurality of small active regions having a relatively small length-to-width ratio and which are all connected in series. The semiconductor layer may extend along a meandering path to increase device resistance.

To use such a magnetoresistor as a position measuring system, it is mounted on a magnet and used along with a ferromagnetic part, such as a movable gear tooth. The movement of the gear tooth across the magnetoresistor changes the magnetic field strength through the magnetoresistor and thereby changes its resistance. One such system is shown in U.S. Pat. No. 4,939,456 (D. T. Morelli et al.), issued Jul. 3, 1990 and entitled "Position Sensor Including a Thin Film Indium Arsenide Magnetoresistor on a Permanent Magnet." When the magnetoresistor is mounted on a magnet made of a conductive material, a dielectric insulating layer is provided between the magnet and the magnetoresistor to insulate one from the other. Also, it has been found desirable to coat the magnet with a high permeability ferromagnetic layer to increase the sensitivity of the device, such as disclosed in U.S. Pat. No. 4,926,122 to T. Schroeder et al., issued May 15, 1990. However, it would be desirable to further increase the sensitivity of the device by concentrating the magnetic field primarily to the active areas of the sensor.

SUMMARY OF THE INVENTION

The present invention is directed to a magnetic field sensor of the type having a strip of a material whose characteristics vary when the strip is subjected to a magnetic field and which is divided into active regions. The strip is mounted on a magnet with a layer of a ferromagnetic material being across the strip. The ferromagnetic layer is in close proximity only to the strip and, more particularly, to only the active regions of the strip.

More particularly, the magnetic field sensor of the present invention comprises a body having on a surface thereof a strip of a layer of a material whose characteristics vary when a magnetic field is applied thereto. Conductive regions are on the strip and form active regions of the strip therebetween. The body is mounted on a magnet assembly. A layer of a ferromagnetic material is across the strip with the ferromagnetic material extending in close proximity to only the strip.

The invention will be better understood from the following more detailed description taken with the accompanying drawings.

It should be understood that the drawings are not necessarily drawn to scale.

DETAILED DESCRIPTION

Figure 1:
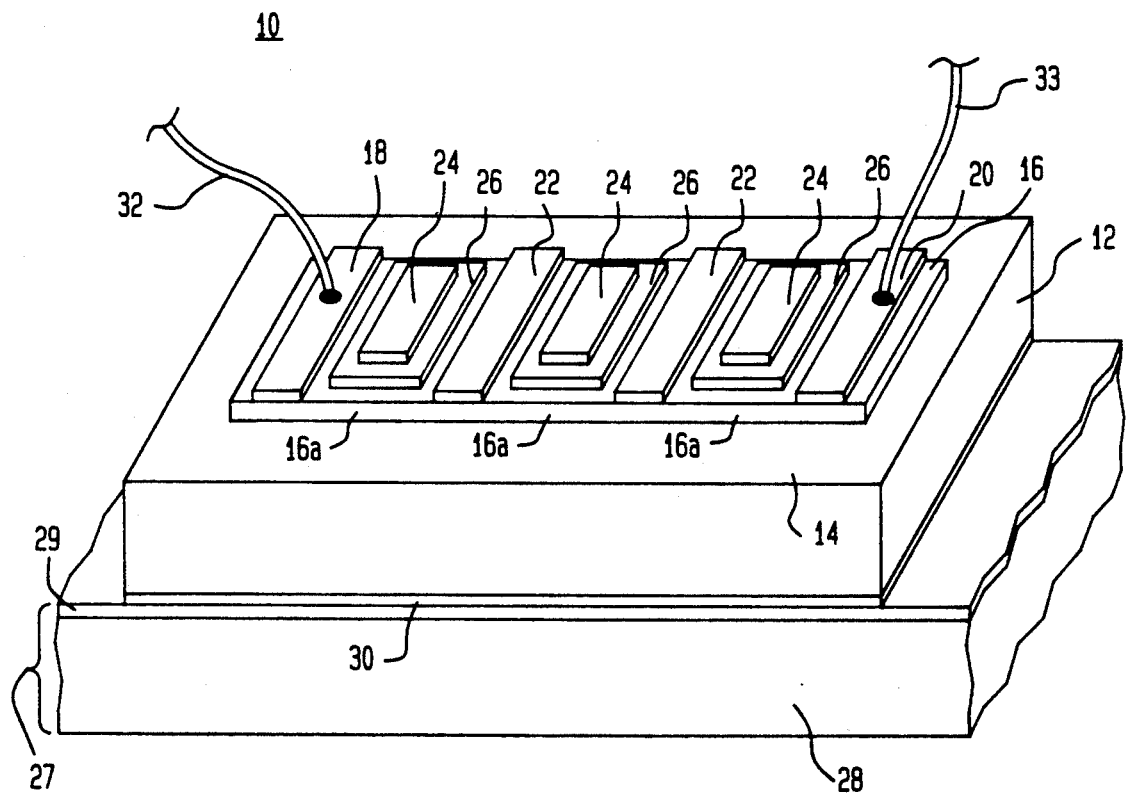
FIG. 1 is a perspective view of a magnetoresistor in accordance with the present invention.

Referring now to FIG. 1, there is shown a perspective view of a magnetoresistor 10 in accordance with the present invention. The magnetoresistor 10 comprises a body (substrate) 12 of an insulating material, such as semi-insulating GaAs, InP, Si or Si coated with a thin film of an insulating InP, GaAs or $Al_{1-x}Ga_xAs$, having on a surface 14 thereof a strip 16 of a layer of a material whose characteristics, such as resistance, vary when a magnetic field is applied thereto. Preferably, the strip 16 is of a high electron mobility semiconductor material, such as InSb or InAs, which is doped to n-type conductivity to increase the stability of carrier density with temperature fluctuations. Also, it is preferable that the layer forming the strip 16 be relatively thin, typically of a thickness of no greater than about 5 microns. A pair of conductive contacts 18 and 20, typically of a metal, are on the semiconductor strip 16 at opposite ends of the strip 16 so as to be spaced apart. On the surface of the semiconductor strip 16 between the contacts 18 and 20 are usually shorting bars 22 of a conductive material, such as a metal. Two such shorting bars 22 are shown. The shorting bars 22 are uniformly spaced apart along the semiconductor strip 16 between the contacts 18 and 20. This divides the semiconductor strip 16 into a plurality of active regions 16a which are electrically connected in series. The spacing between the shorting bars 22 is such that the active regions 16a preferably have a relatively small length (distance along semiconductor layer between shorting bars) to width (width of semiconductor layer) ratio.

On the surface of each of the active regions 16a of the semiconductor strip 16 are a plurality of separated layers 24 of a ferromagnetic material. The ferromagnetic material is preferably magnetically "soft" in that it has low coercivity, high magnetic permeability and high saturation flux density. Such materials include iron, nickel, cobalt and various alloys thereof. The width of the ferromagnetic layers 24 corresponds to the smallest lateral dimension of the active regions 16a of the strip 16. Since these ferromagnetic materials are usually conductive, a layer 26 of a dielectric insulator is provided between each of the ferromagnetic layers 24 and the surface of its respective active region 16a. The body 12 is mounted on a permanent magnet assembly 27. The permanent magnet assembly 27 comprises a permanent magnet 28, preferably having thereon a soft ferromagnetic layer 29 which covers essentially the entire surface of the permanent magnet 28, as disclosed in U.S. Pat. No. 4,926,122. The permanent magnet assembly 27 is typically much larger than the magnetoresistor assembly 10. If the magnet 28 is of a conductive material, a layer 30 of a dielectric insulating material may be provided between the magnet 28 and the body 12. The dielectric insulating layer 30 is not needed if the body 12 is sufficiently insulating. Terminal wires 32 and 33 are secured to the contacts 18 and 20, respectively.

In the magnetoresistor 10, the ferromagnetic layers 24 are in close proximity to only the active regions 16a of the semiconductor layer 16. This causes the magnetic field to be concentrated in the active regions 16a and not in the inactive regions under the contacts 18 and 20 and the shorting bars 22. This, in turn, improves the sensitivity of the magnetoresistor 10.

The aspect ratio of the ferromagnetic layers 24 is defined as their height, or thickness, divided by their width (their smallest lateral dimension). Ferromagnetic layers with an aspect ratio of at least in the order of 1 (e.g., between 0.5 and 2) are preferable. This aspect ratio has a greater effect in concentrating the magnetic flux than smaller aspect ratios (e.g., 0.1). However, very large aspect ratios would be undesirable if the magnetic flux in the ferromagnetic layers 24 exceeds the saturation magnetization of the ferromagnetic material. A problem with small aspect ratios in nominally isotropic ferromagnetic materials is that there is a geometric anisotropic which tends to make the ferromagnetic layers magnetize laterally rather than vertically. This geometric anisotropic can be overcome by the use of single crystalline or partially oriented polycrystalline ferromagnetic materials in which the easy magnetization axis is perpendicular to the plane of the film.

Figure 2:
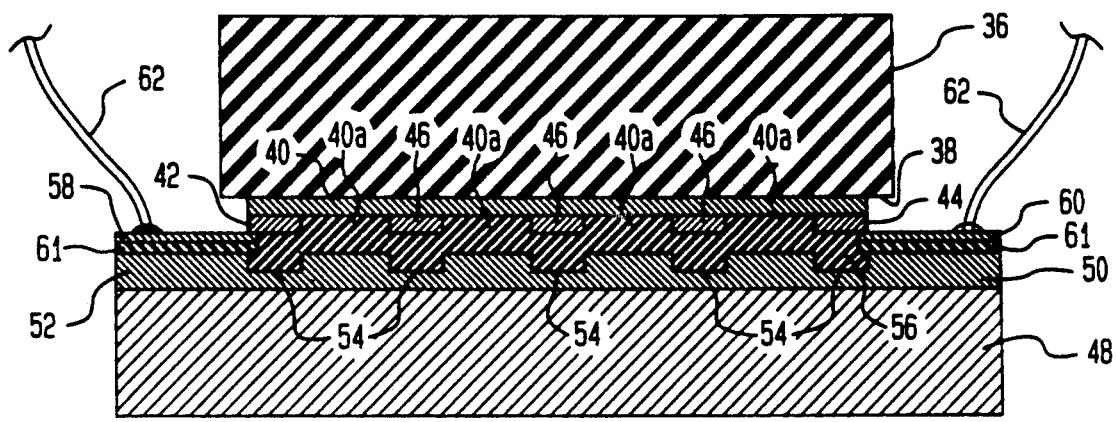
FIG. 2 is a cross-sectional view of another magnetoresistor in accordance with the present invention.

Referring now to FIG. 2, there is shown a cross-sectional view of another magnetoresistor 34 in accordance with the present invention. The magnetoresistor 34 comprises a body (substrate) 36 of an insulating material, such as semi-insulating GaAs, InP, Si or Si coated with a thin film of insulating InP, GaAs or $Al_{1-x}Ga_xAs$, having a surface 38. On the surface 38 is a strip 40 of a layer of a high electron mobility semiconductor material whose characteristics, such as resistance, vary when a magnetic field is applied thereto. On the semiconductor strip 40 are conductive contacts 42 and 44 which are at the ends of the semiconductor strip 40. Conductive shorting bars 46 are on the semiconductor layer 40 between the contacts 42 and 44. The shorting bars 46 are spaced apart along the semiconductor strip 40 to divide it into active regions 40a preferably having a low length-to-width ratio.

The body 36 is mounted on a permanent magnet 48 with the semiconductor strip 40, contacts 42 and 44 and the shorting bars 46 facing a surface 50 of the magnet 48. On the surface 50 of the magnet 48 is a layer 52 of a ferromagnetic material. The ferromagnetic layer 52 has spaced recesses 54 therein which are aligned with the contacts 42 and 44 and the shorting bars 46. Thus, the ferromagnetic layer 52 is in close proximity to only the active regions 40a of the semiconductor layer 40. The recesses 54 may, as shown, extend only part way through the thickness of the ferromagnetic layer 52 or they may extend completely through the ferromagnetic layer 52. The recesses 54 may be formed by a stamping process or by using photolithography and a chemical etching process. Although the recesses 54 are shown to be rectangular, they may have other shapes, such as triangular or cylindrical. These other shapes may be easier to manufacture and may be more effective in concentrating the magnetic flux into the desired regions of the sensor.

In the magnetoresistor 34, the ferromagnetic layer 52 serves a dual role. By extending the ferromagnetic layer 52 over essentially the entire surface 50 of the magnet 48, it is part of the permanent magnet assembly. With recesses 54, it also concentrates the flux toward the active areas 40a of the semiconductor strips 40. The recesses 54 may extend over the entire surface of the magnetic assembly if desired. Other recess areas may be added, if desired, to aid in the optical alignment of the sensor chip 36 with the recesses 54.

The body 36 is secured to the magnet 48 by a layer 56 of an insulating adhesive material which is between the ferromagnetic layer 52 and the semiconductor strip 40, contacts 42 and 44 and the shorting bars 46. Conductive contacts 58 and 60 are on the ferromagnetic layer 52 and are insulated from the ferromagnetic layer 52 by a layer 61 of a dielectric insulating material. The contacts 58 and 60 are engaged by the contacts 42 and 44, respectively, so as to be electrically connected thereto. Terminal wires 62 are connected to the contacts 58 and 60 so as to be electrically connected to the semiconductor strip 40.

Figure 3:
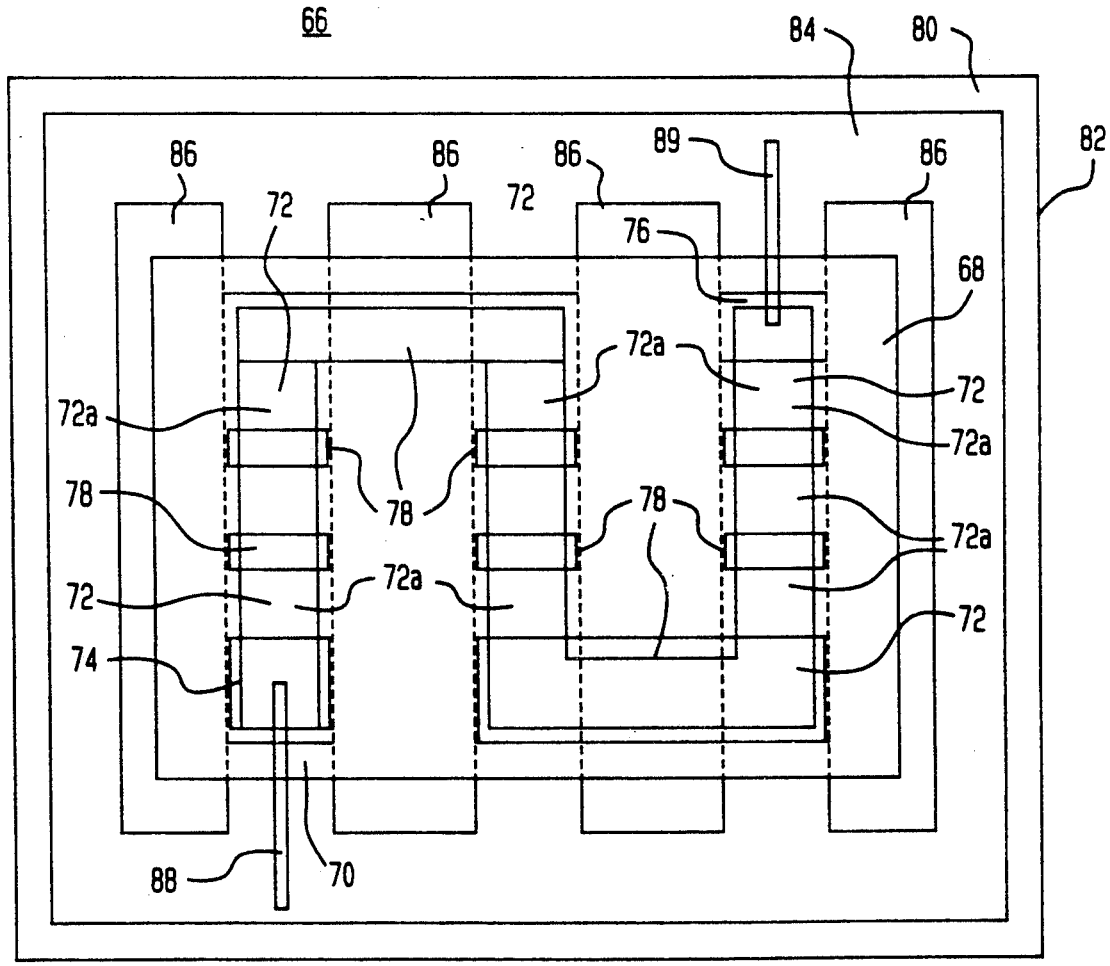
FIG. 3 is a top plan view of still another magnetoresistor in accordance with the present invention.

Referring now to FIG. 3, there is shown a top plan view of still another magnetoresistor 66 in accordance with the present invention. The magnetoresistor 66 comprises a body (substrate) 68 of an insulating material, such as semi-insulating GaAs or InP. On a surface 70 of the body 68 is a strip 72 of a high mobility semiconductor material which extends in a meandering path (shown as two connected U's or an "S"). Conductive contacts 74 and 76 are on the semiconductor strip 72 at the ends thereof. Conductive shorting bars 78 are on the semiconductor strip 72 spaced along the strip between the contacts 74 and 76 to divide the strip 72 into active regions 72a.

The body 68 is mounted on a surface 80 of a permanent magnet assembly 82. On the magnet assembly surface 80 between the magnet assembly 82 and the body 68 is a layer 84 of a ferromagnetic material. Regions 86 of the ferromagnetic layer 84 which are along the sides of the strip 72 and do not extend over the active regions 72a of the strip 72 are either removed or have recesses therein. Thus, the ferromagnetic layer 84 is in close proximity to only the strip 70. Conductive leads 88 and 89 are connected to the contacts 74 and 76, respectively. Although the ferromagnetic layer 84 is shown as being on the surface 88 of the permanent magnet 82, the ferromagnetic layer 84 can be coated directly on semiconductor strip 72.

In a prepared embodiment of the invention, in the magnetoresistor 66, the ferromagnetic layer 84 is in close proximity to only the semiconductor strip 72 so as to concentrate the magnetic field to the strip 72 and away from any inactive portion of the device. This improves the sensitivity of the magnetoresistor 66. To further improve the sensitivity of the magnetoresistor 66, the ferromagnetic layer 84 may be defined to be in close proximity to only the active regions 72a of the semiconductor strip 72.

Figure 4:
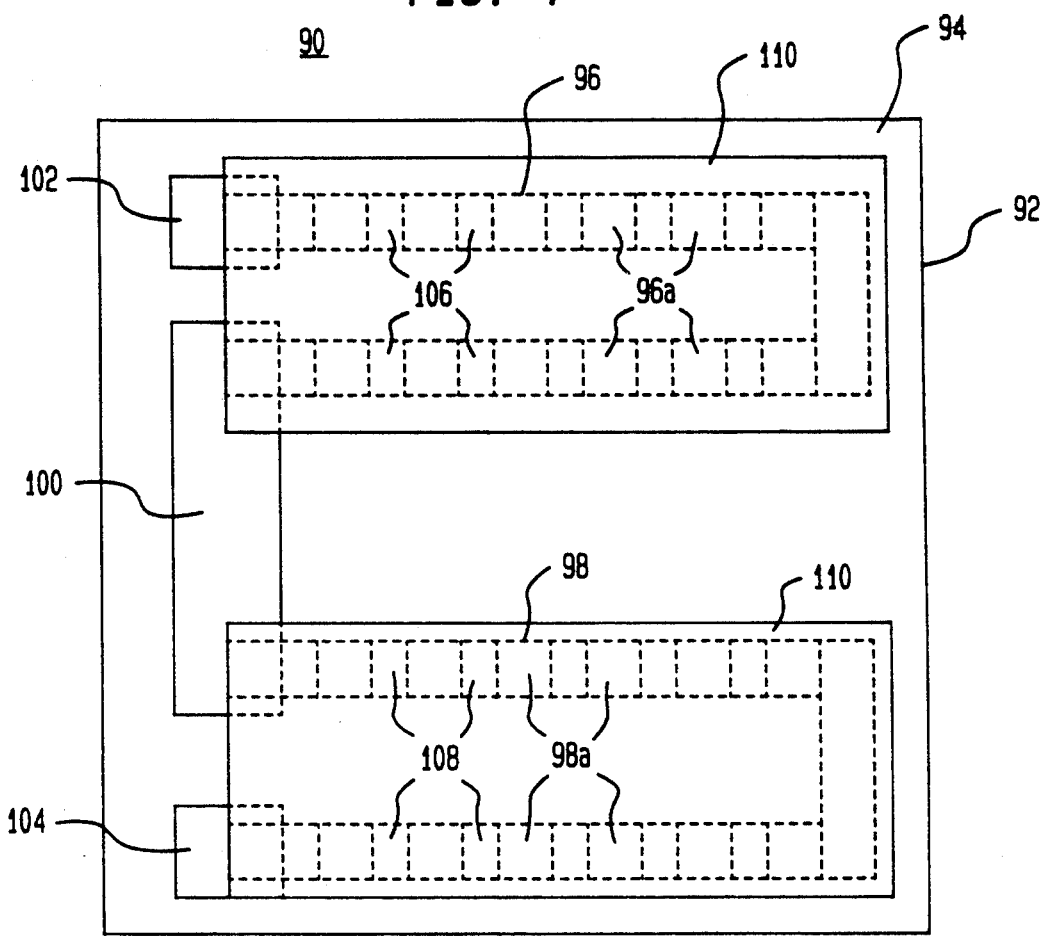
FIG. 4 is a top plan view of still another magnetoresistor in accordance with the present invention.

Referring now to FIG. 4, there is shown a top plan view of a dual magnetoresistor 90 in accordance with the present invention. The magnetoresistor 90 comprises a body 92 (substrate) of an insulating material, such as semi-insulating GaAs or InP. On a surface 94 of the body 92 are two strips 96 and 98 of a high mobility semiconductor material. The strips 96 and 98 are each in the form of a U and are arranged in parallel positions. A conductive connecting contact 100 is on the body surface 94 and contacts one end of each of the strips 96 and 98. Separate conductive contacts 102 and 104 are on the other ends of each of the strips 96 and 98, respectively. Conductive shorting bars 106 are on the strip 96 and are spaced therealong between the contacts 100 and 102 to divide the strip 96 into a plurality of active regions 96a. Conductive shorting bars 108 are on the strip 98 and are spaced therealong between the contacts 100 and 104 to divide the strip 98 into a plurality of active regions 98a.

A separate layer 110 of a ferromagnetic material is over each of the strips 96 and 98. Each ferromagnetic layer 110 is defined so that it is in close proximity to only its respective strip 96 and 98. This can be achieved by either completely removing or providing recesses in the portions of the ferromagnetic layers 110 not over the strips 96 and 98. The body 92 is mounted on a permanent magnet assembly (not shown). The magnet assembly may be on the same side or the opposite side of the body 92 as the strips 96 and 98. The ferromagnetic layers 110 may be coated on the magnet or on the body 92. Separate terminals (wires), not shown, are connected to the contacts 100, 102 and 104.

In the dual magnetoresistor 90, the ferromagnetic layers 110 are in close proximity to only the semiconductor strips 96 and 98 so as to concentrate the magnetic fields to the semiconductor strips 96 and 98 and thereby improve the sensitivity of the magnetoresistor 90. The sensitivity of the magnetoresistor 90 can be further improved by defining the ferromagnetic layers 110 so that they are in close proximity to only the active regions 96a and 98a of the strips 96 and 98.

Figure 5:
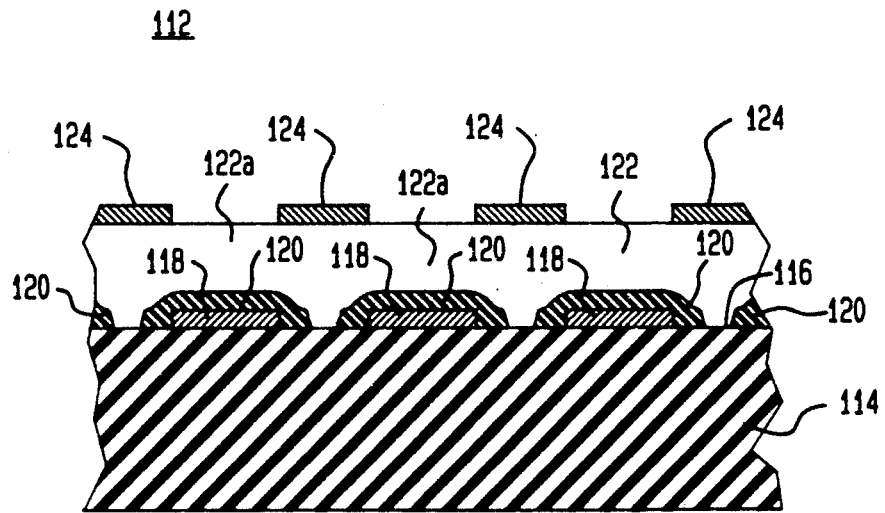
FIG. 5 is a sectional view of still a further magnetoresistor in accordance with the present invention.

Referring now to FIG. 5, there is shown a cross-sectional view of a portion of another magnetoresistor 112 in accordance with the present invention. The magnetoresistor 112 comprises a body (substrate) 114 of an insulating material, such as semi-insulating GaAs or InP. On a surface 116 of the body 114 are a plurality of spaced layers 118 of a ferromagnetic material. A layer 120 of an insulating material is on the body surface 116 and over the ferromagnetic layers 118. A strip 122 of a layer of a high mobility semiconductor material is on the insulating layer 120. Conductive shorting bars 124 are on the semiconductor strip 122 and are spaced therealong to divide the semiconductor strip 122 into a plurality of active regions 122a. The shorting bars 124 are positioned over the spaces between the ferromagnetic layers 118 so that each of the active regions 122a is directly over a separate ferromagnetic layer 118. Thus, the ferromagnetic layers 118 are in close proximity to the active regions 122a. A permanent magnet assembly (not shown) is mounted on the magnetoresistor 112 at either side of the body 114.

The magnetoresistor 112 can be made by coating a layer of a ferromagnetic material, such as iron or iron oxide, on the surface 116 of the body 114. The layer is defined, using photolithography and etching, to form the spaced layers 118. The insulating layer 120, such as of silicon dioxide, silicon nitride, aluminum nitride, gallium nitride or aluminum oxide, is deposited on the body surface 116 and over the ferromagnetic layers 118. Openings are formed in the insulating layer 120 to expose the body 114 in certain regions. Selective growth of gallium arsenide is then carried out in the exposed regions of the body 114 using the technique described in the article entitled, "Anisotropic Lateral Growth in GaAs MOCVD Layers on (001) Substrates," by H. Asai, published in *Journal of Crystal Growth*, Vol. 80, 1987, pgs. 425–433. This is followed by changing the gallium arsenide growth conditions to obtain lateral epitaxial growth as described in the article entitled, "Lateral Epitaxial Overgrowth of GaAs by Organometallic Chemical Vapor Deposition," by R. P. Gale et al., published in *Applied Physics Letters*, Vol. 41(6), Sep. 15, 1982, pgs. 545–547. A thin layer of the high mobility semiconductor material, such as InSb or InAs, is then deposited on the gallium arsenide layer and defined to form the strip 122. A metal layer is then deposited over the semiconductor strip 122 and defined, using photolithographic techniques and etching, to form the shorting bars 124.

Figure 6:
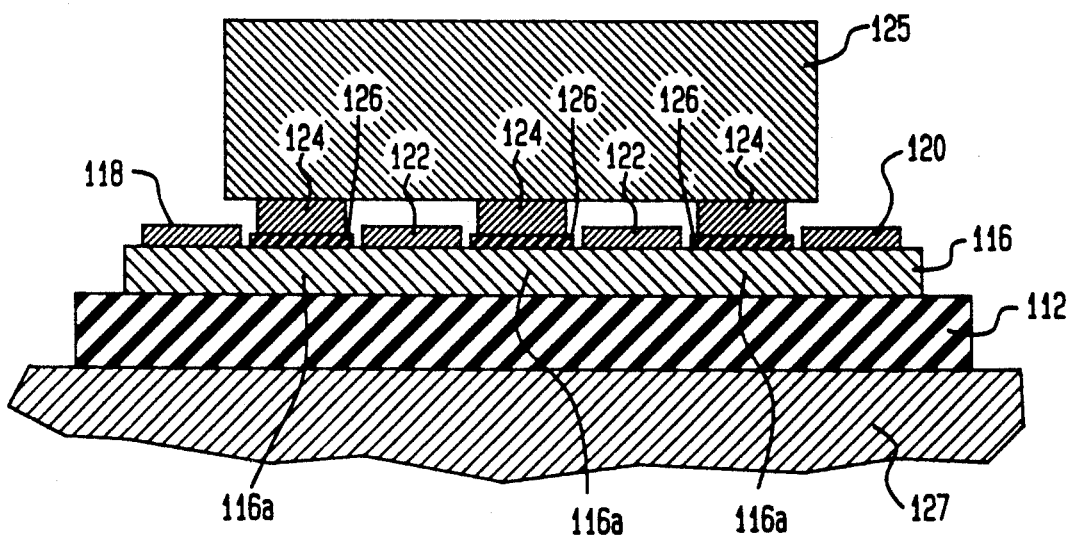
FIG. 6 is a sectional view of a modification of the magnetoresistor shown in FIG. 1.

Referring now to FIG. 6, there is shown a cross-sectional view of a magnetoresistor 100, which is similar to the magnetoresistor 10 shown in FIG. 1. Therefore, the parts of the magnetoresistor 100 which are the same as those of the magnetoresistor 10 will be indicated by the same reference number with the prefix "1". The magnetoresistor 100 comprises a body 112 of an insulating material having on a surface 114 thereof a strip 116 of a semiconductor material, such as described for the semiconductor strip 16 of the magnetoresistor 10. Conductive contacts 118 and 120 are on the semiconductor strip 116 at opposite ends of the strip 116 and shorting bars 122 are uniformly spaced apart along the semiconductor strip 116 between the contacts 118 and 120. This divides the strip 116 into a plurality of active regions 116a.

On the surface of each of the active regions 116a is a separate layer 124 of a soft ferromagnetic material. A layer 126 of a dielectric insulator is between each of the ferromagnetic layers 124 and the surface of its respective active region 116a. The magnetoresistor 100 differs from the magnetoresistor 10 in that it includes a layer 125 of a soft ferromagnetic material which connects the individual ferromagnetic layers 124 and extends over the shorting bars 122. This additional ferromagnetic layer 125 reduces the flux through the shorting bars 122 and further concentrates the flux through the ferromagnetic layers 124 and the active regions 116a under them. The body 112 is mounted on a magnet assembly 127 similar to the magnet assembly 27 shown in FIG. 1.

Thus, there is provided by the present invention a magnetoresistor integrated with a magnet assembly and having a ferromagnetic material thereon. The ferromagnetic material is in close proximity to only the semiconductor strip of the magnetoresistor so as to confine the magnetic field to the semiconductor strip. This provides a more sensitive magnetoresistor. The sensitivity is further improved by having the ferromagnetic material in close proximity to only the active regions of the semiconductor. The ferromagnetic material may be coated on a surface of the magnet assembly or directly on the body of the magnetoresistor. Also, the ferromagnetic material may be provided only over the semiconductor strip(s) or the active regions of the semiconductor strip(s) or may be over the entire device and provided with recesses which space the ferromagnetic layer from the nonactive portions of the magnetoresistor.

It is to be appreciated and understood that the specific embodiments of the invention are merely illustrative of the general principles of the invention. Various modifications may be made consistent with the principles set forth. For example, although the invention has been described as being used in a magnetoresistor, it may be used in other magnetic field sensors, such as Hall effect devices, MAGFET devices (see the article of H. P. Baltes and R. S. Popovic, published in the *Proceedings of IEEE*, Vol. 74, 1986, pages 1107-1132) or a superlattice structure. In a superlattice structure, an antiferromagnetically ordered superlattice of materials, such as Co/Cu or Fe/Cr, orders ferromagnetically in an applied magnetic field, thus changing the electrical resistance of the superlattice (see the article of S. S. Parkin, Z. G. Li and D. J. Smith published in *Applied Physics Letters*, Vol. 58, 1991, pages 2710-2712). For example, in a Hall effect device in which the active layer has four arms extending from a common point, the ferromagnetic layer would be placed under or over the active layer at the junction of the four arms. The ferromagnetic layer would preferably have a thickness which is comparable to or larger than its lateral dimensions so as to have an aspect ratio of the order of unity or greater.

Still further, various materials can be used for the active layer of the magnetic field sensor. Furthermore, in the dual magnetoresistor 90 described with regard to FIG. 4, which shows two magnetoresistor elements 96 and 98, the magnetoresistor 90 may have more than two magnetoresistor elements if desired. Also, the additional ferromagnetic layer 125 shown in FIG. 6 would also be used in the magnetoresistors 66 and 90 shown in FIGS. 3 and 4.

In addition, the magnet assemblies of the sensors shown in FIGS. 1, 3, 4 and 7 have, in addition to the magnet and the ferromagnetic layer covering the magnet, a ferromagnetic object, such as a gear which has a position to be sensed, moving near the sensor. However, alternatively, the magnet assembly (or just the magnet) can be removed. A moving magnetic part, such as a wheel which is magnetized differently in different places along its circumference, is then moved or rotated near the sensor. This causes the magnetic field through the sensor to change, which then allows the movement to be sensed.

The embodiments of the invention in which an exclusive property or privilege is claimed are defined as follows:

1. A magnetic field sensor comprising:
   a body having a surface;
   a strip of a material whose characteristics vary when a magnetic field is applied thereto on said surface of the body;
   spaced conductive layers on said strip forming active regions on the strip therebetween;
   a permanent magnet assembly mounted on said body across the strip; and
   a layer of a ferromagnetic material over said body and in close proximity only to said strip.

2. The magnetic field sensor of claim 1 in which the ferromagnetic layer is in close proximity to only the active regions of said strip.

3. The magnetic field sensor of claim 2 including a ferromagnetic layer on each of the active regions of the strip between adjacent conductive layers.

4. The magnetic field sensor of claim 3 further comprising a layer of an insulating material between each of the ferromagnetic layers and its respective active region of the strip.

5. The magnetic field sensor of claim 1 in which the ferromagnetic layer is between the permanent magnet assembly and the body.

6. The magnetic field sensor of claim 5 in which the ferromagnetic layer has recesses therein directly opposite the conductive layers on the strip so as to be in close proximity to only the active regions of the strip between the conductive layers.

7. The magnetic field sensor of claim 6 in which the magnet assembly is mounted on the body with the strip facing the magnet assembly and a layer of an insulating material is between the strip and the ferromagnetic layer.

8. The magnetic field sensor of claim 1 in which the strip extends in a meandering path.

9. The magnetic field sensor of claim 8 in which the magnet assembly comprises the ferromagnetic layer on a permanent magnet and the ferromagnetic layer is provided with recesses therethrough which extend along the sides of the strip so that the ferromagnetic layer is in close proximity to only the strip.

10. The magnetic field sensor of claim 9 in which the recesses extend completely through the ferromagnetic layer.

11. The magnetic field sensor of claim 1 further comprising a layer of an insulating material on the surface of the body, the strip is on the insulating layer, the conductive layers are on and spaced along the strip, and layers of the ferromagnetic material are between the substrate and the insulating layer and are positioned in close proximity to the active region of the strip between the conductive regions.

12. A magnetic field sensor comprising:
    a permanent magnet assembly having a surface;
    a body of an insulating material on said surface of the magnet assembly;
    a strip of a layer of a high electron mobility semiconductor material on the body;
    conductive contacts on said strip at the ends thereof;
    conductive shorting bars on said strip and spaced therealong to divide said strip into active regions; and
    a layer of a ferromagnetic material over and in close proximity to only said strip.

13. The magnetic field sensor of claim 12 in which the ferromagnetic layer is in close proximity to only the active regions of said strip.

14. The magnetic field sensor of claims 13 including a ferromagnetic layer on each of the active regions of the strip.

15. The magnetic field sensor of claim 14 further comprising a layer of an insulating material between each of the ferromagnetic layers and its respective active region of the strip.

16. The magnetic field sensor of claim 12 in which the magnet assembly comprises the ferromagnetic layer on and covering essentially the surface of a permanent magnet and is between the magnet and the body.

17. The magnetic field sensor of claim 16 in which the ferromagnetic layer has recesses therein directly opposite the contacts and the shorting bars so as to be in close proximity to only the active regions of the strip.

18. The magnetic field sensor of claim 17 in which the body is mounted on the magnet with the strip facing the magnet and a layer of an insulating material is between the strip and the ferromagnetic layer.

19. The magnetic field sensor of claim 12 in which the strip extends in a meandering path.

20. The magnetic field sensor of claim 19 in which the magnet assembly comprises the ferromagnetic layer on a permanent magnet and the ferromagnetic layer is provided with recesses therein which extend along the sides of the strip so that the ferromagnetic material is in close proximity to only the strip.

21. The magnetic field sensor of claim 20 in which the recesses extend completely through the ferromagnetic layer.

22. The magnetic field sensor of claim 12 further comprising a layer of an insulating material on the surface of the body, the strip is on the insulating layer, the contacts and shorting bars are on the strip, and layers of the ferromagnetic material are between the substrate and the insulating layer and positioned in proximity to only the active regions of the strip.

* * * * *